(12) United States Patent
Block et al.

(10) Patent No.: US 11,329,129 B2
(45) Date of Patent: May 10, 2022

(54) TRANSISTOR CELL FOR INTEGRATED CIRCUITS AND METHOD TO FORM SAME

(71) Applicant: GLOBALFOUNDRIES U.S. Inc., Santa Clara, CA (US)

(72) Inventors: Stefan G. Block, Munich (DE); Farid Labib, Munich (DE); Herbert J. Preuthen, Dorfen (DE)

(73) Assignee: GlobalFoundries U.S. Inc., Santa Clara, CA (US)

( * ) Notice: Subject to any disclaimer, the term of this patent is extended or adjusted under 35 U.S.C. 154(b) by 57 days.

(21) Appl. No.: 16/693,472

(22) Filed: Nov. 25, 2019

(65) Prior Publication Data

US 2021/0159313 A1    May 27, 2021

(51) Int. Cl.
*H01L 29/06*     (2006.01)
*H01L 21/8238*   (2006.01)
*H01L 27/092*    (2006.01)

(52) U.S. Cl.
CPC .. *H01L 29/0696* (2013.01); *H01L 21/823892* (2013.01); *H01L 27/092* (2013.01)

(58) Field of Classification Search
CPC ......... H01L 29/0696; H01L 21/823892; H01L 27/092; H01L 27/0207–0211
USPC ....................................................... 257/369
See application file for complete search history.

(56) References Cited

U.S. PATENT DOCUMENTS

| | | | |
|---|---|---|---|
| 9,780,231 B1* | 10/2017 | Li | H01L 29/7881 |
| 2010/0078705 A1* | 4/2010 | Chakihara | H01L 29/792 257/324 |
| 2011/0233629 A1* | 9/2011 | Han | H01L 27/088 257/296 |
| 2014/0177312 A1* | 6/2014 | Shibata | G11C 11/417 365/72 |

OTHER PUBLICATIONS

Barua et al., "Mixed FBB and RBB Low Leakage Technique for High Durable CMOS Circuit," 3rd International Conference on Informatics, Electronics & Vision 2014, 5 pages.

* cited by examiner

*Primary Examiner* — Mohammad M Hoque
(74) *Attorney, Agent, or Firm* — Hoffman Warnick LLC

(57) ABSTRACT

The disclosure provides transistor cells for integrated circuits and methods to form the same. A transistor cell according to the disclosure may include a substrate region including width between a first end and a second end, and a length between a third end and a fourth end in a direction orthogonal to the width. A first doped well (FDW) within the substrate region may be oppositely doped and may extend from the first end to a first interior boundary between the first and second ends of the substrate region, and from the third end to a second interior boundary between the third and fourth ends. A second doped well (SDW) within the substrate region may extend from the second end to a third interior boundary between the first and second ends, and the fourth end to a fourth interior boundary between the third and fourth ends.

13 Claims, 5 Drawing Sheets

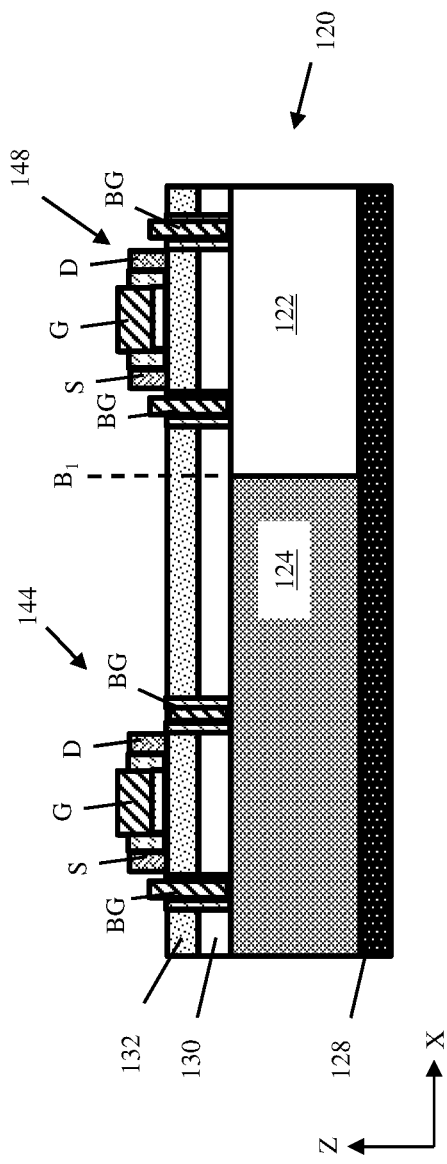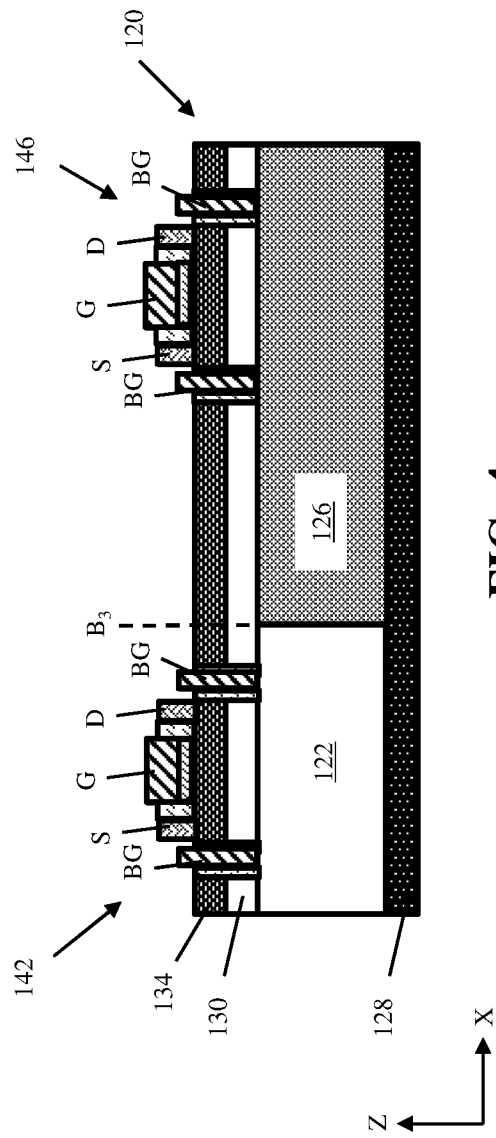

TRANSISTOR CELL FOR INTEGRATED CIRCUITS AND METHOD TO FORM SAME

TECHNICAL FIELD

Embodiments of the disclosure relate generally to embodiments of a transistor cell for integrated circuits and related methods, which may use automatic placement and routing of transistor types. Various embodiments of the transistor cell architecture are operable for placement between flipped and non-flipped transistor cells of a device, and/or between transistor cells of varying size.

BACKGROUND

In the microelectronics industry as well as in other industries involving construction of microscopic structures, there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at atomic level scaling of certain micro-devices such as logic gates, FETs, and capacitors. Circuit chips with hundreds of millions of such devices are common.

Standard cell design is a methodology to design the layout of an integrated circuit with various predetermined digital logic features and configurations, e.g., used for automatic placement and routing. Using known configurations of transistors to implement various logic gate structures, the device layer of a product may be separated into individual cells where the transistors may be formed. In many devices, it may be necessary to subdivide portions of the device layer into regions of doped and non-doped substrate regions with different configurations, e.g., flipped well and non-flipped well cells. To maintain reliable operation, these types of cells are conventionally separated by vacant space. The presence of vacant space may limit the total number of transistors, and thus accompanying logic functions, which may be formed within the surface area of a device.

SUMMARY

A first aspect of the present disclosure provides a transistor cell including: a substrate region having a first doping type and including a width between a first end and a second end, and a length between a third end and a fourth end in a direction orthogonal to the width; a first doped well (FDW) within the substrate region, the FDW having a second doping type and an FDW width extending from the first end to a first interior boundary between the first and second ends of the substrate region, and an FDW length extending from the third end to a second interior boundary between the third and fourth ends; and a second doped well (SDW) within the substrate region, the SDW having the second doping type and an SDW width extending from the second end to a third interior boundary between the first and second ends, and a length extending from the fourth end to a fourth interior boundary between the third and fourth ends, wherein the first interior boundary is non-aligned with the third interior boundary, and wherein a portion of the fourth interior boundary abuts a portion of the second interior boundary.

A second aspect of the present disclosure provides an integrated circuit (IC), including: a doped barrier region within a semiconductor substrate; a first plurality of transistor cells each abutting a first exterior boundary of the doped barrier region, the first plurality of transistor cells including a first set of substrate regions alternating with a set of first doped wells (FDWs), wherein each of the set of substrate regions and each of the set of FDWs includes a first length; and a second plurality of transistor cells each abutting a second exterior boundary of the doped barrier region opposite the first exterior boundary, the second plurality of transistor cells including a second set of substrate regions alternating with a set of second doped wells (SDWs), wherein each of the second set of substrate regions and each of the set of SDWs includes a second length different from the first length.

A third aspect of the present disclosure provides a method of forming an integrated circuit (IC), the method including: forming a first transistor cell within a semiconductor substrate, the first transistor cell including a substrate region abutting a doped well region in a first orientation; forming a second transistor cell within the semiconductor substrate, the second transistor cell including a substrate region abutting a doped well region in a second orientation opposite the first orientation, wherein the second transistor cell is horizontally aligned with, and separated from, the first transistor cell by an interposer region having a first doping type; and forming a third transistor cell within the interposer region, wherein forming the third transistor cell includes: forming a first doped well (FDW) within the interposer region, the FDW having a second doping type and an FDW width extending from the first transistor cell to a first interior boundary between the first and second transistor cells, and an FDW length extending from a lower end of the interposer region to a second interior boundary between the lower end and an upper end of the interposer region, and forming a second doped well (SDW) within the interposer region, the SDW having the second doping type and an SDW width extending from the second transistor cell to a third interior boundary between the first and second transistor cells, and a length extending from the upper end to a fourth interior boundary between the upper and lower ends, wherein the first interior boundary is non-aligned with the third interior boundary, and wherein a portion of the fourth interior boundary abuts a portion of the second interior boundary.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 3 depicts a cross-sectional view of a transistor cell structure according to embodiments of the disclosure along line 3-3 of FIG. 2.

FIG. 4 depicts a cross-sectional view of a transistor cell structure according to embodiments of the disclosure along line 4-4 of FIG. 2.

Figure 1:
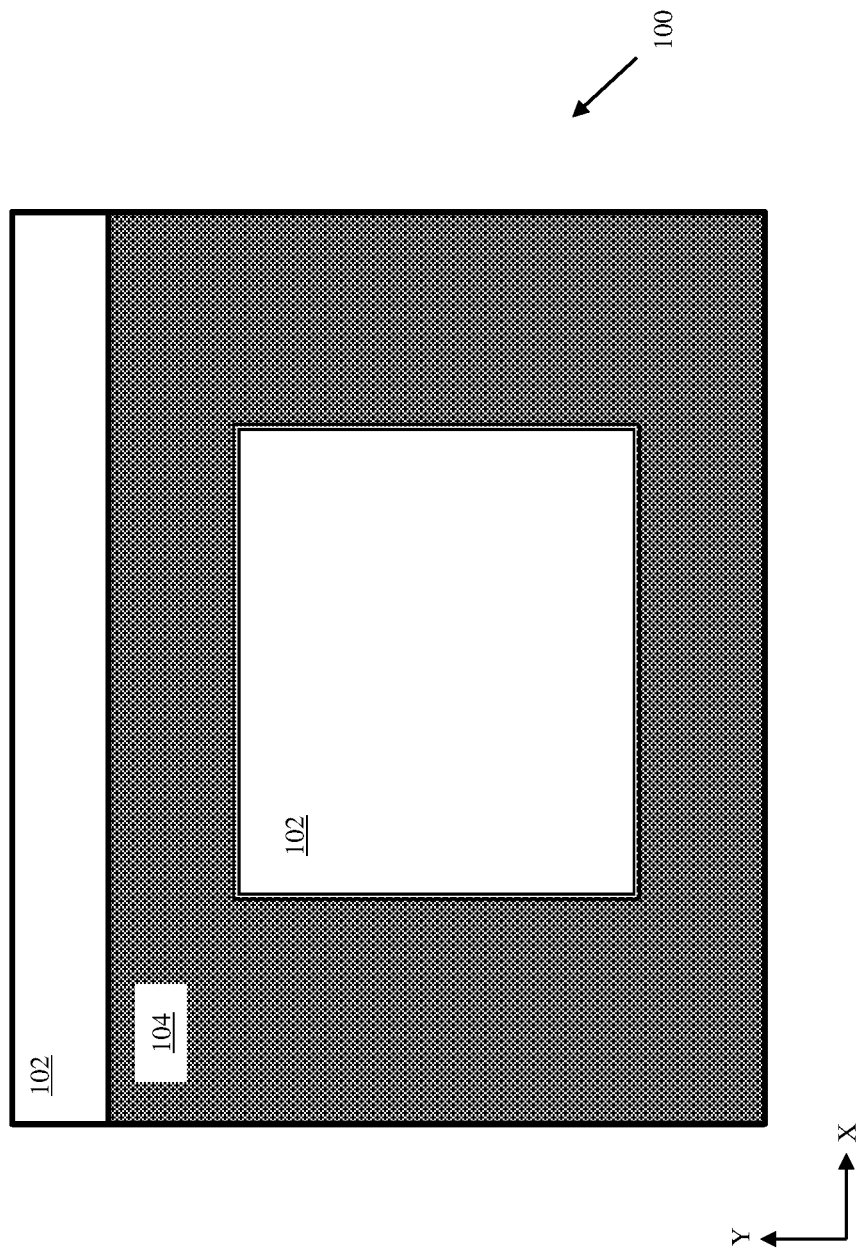
FIG. 1 depicts a plan view of an integrated circuit (IC) subdivided into multiple doped regions according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure pertain to transistor cell structures, integrated circuits (ICs) including transistor cell structures, and methods to form ICs with various types of transistor cell structures. In many devices, it may be necessary to subdivide portions of the device layer into regions of doped and non-doped substrate regions with different configurations, e.g., flipped well and non-flipped well cells. Embodiments of the disclosure provide a transistor cell structure operable to separate different doped substrate regions from each other without using vacant space between the different regions. Further embodiments of the disclosure are operable to separate regions of differently-sized transistor cells from each other. Embodiments of a transistor cell according to the disclosure may be positioned between one or more transistor cells of a first doping type (e.g., including a substrate region and a doped well region arranged in a first orientation) and one or more transistor cells of a second doping type (e.g., substrate and doped well regions in a second, opposite orientation).

A transistor cell according to the disclosure can include first and second doped wells each having a boundary which partially abuts and overlaps with a boundary of the other well. Various transistors and/or other device components may be formed on the transistor cell in addition to any transistors and/or other components formed on adjacent transistor cells. Embodiments of the disclosure reduce the amount of vacant space in a device and may yield greater device densities.

FIG. 1 depicts an integrated circuit (IC) layout 100, indicative of a device formed of various transistors and distributed across a two-dimensional area in plane X-Y. Layout 100 may alternatively be known as a "map," "design," "floor plan," or other term referring to the placement of various components (e.g., logic cells and their individual transistors) within a two dimensional area. IC layout 100 may be formed on a substrate of semiconductor material, which may be the base material on/within which further materials (e.g., variously doped well regions, transistor structures, insulator regions, and/or other electrical components of a device) are formed. The substrate material may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity).

Various portions of layout 100 may be doped based on the intended polarity and/or function of transistors and/or other device structures formed thereon. A "dopant" refers to an element introduced into semiconductor to establish either p-type (acceptors) or n-type (donors) conductivity. Dopants are of two types: "donors" and "acceptors." N type implants are donors and P type are acceptors. In the case of a silicon substrate, common dopants may include, e.g., boron (B), and/or Iridium (In), for p-type doping. For n-type doping, the doped element(s) may include, for example, phosphorous (P) arsenic (As), and/or antimony (Sb). Doping is the process of introducing impurities (dopants) into the semiconductor substrate, or elements formed on the semiconductor substrate, and is often performed with a mask (or previously-formed, elements in place) so that only certain areas of the substrate will be doped. For example, doping is used to form the source and drain regions of a transistor. An ion implanter is typically employed for the actual implantation. An inert carrier gas such as nitrogen is usually applied to complete the dopant implantation.

Usually in doping, a dopant, a dosage and an energy level are specified and/or a resulting doping level may be specified. A dosage may be specified in the number of atoms per square centimeter ($cm^2$) and an energy level (specified in keV, kilo-electron-volts), resulting in a doping level (concentration in the substrate) of a number of atoms per cubic centimeter ($cm^3$). The number of atoms is commonly specified in exponential notation, where a number like "3E15" means 3 times 10 to the 15th power, or a "3" followed by 15 zeroes (3,000,000,000,000,000). An example of doping is implanting with B (boron) with a dosage of between about 1E12 and 1E13 atoms/cm$^2$, and an energy of about 40 to 80 keV to produce a doping level of between 1E17 and 1E18 atoms/cm$^3$. Doped portions of a substrate may be known in the art as a "well." A well commonly refers to the implanted/diffused region in semiconductor wafer needed to implement complementary metal oxide semiconductor (CMOS) cell. Depending on the attributes of layout 100, a well may be either n-type or p-type doped.

IC layout 100 may be subdivided into multiple areas, and transistor cells can be formed within the multiple areas of IC layout 100. Each transistor cell formed in IC layout 100 may take the form of a "standard cell." A standard cell is a group of transistor and overlying interconnect structures that is known to yield a predetermined logic function. For example, a library of standard cells may include transistor cells for implementing an "and gate," an "or gate," an "exclusive or" gate, an "exclusive nor" gate, an inverter, and/or storage functions such as a latch or flip-flop. Various libraries of standard cells may include the placement of, and electrical connections to, transistors within a uniform two-dimensional surface area.

A popular design paradigm for IC processing is the CMOS transistor. CMOS transistors include N-channel and P-channel MOS transistors formed on the same wafer. CMOS is a popular configuration due to very low power consumption and dissipation as well minimization of the current in "off" state. CMOS is also an effective device configuration for implementation of digital functions. In CMOS, each transistor may designed for current to flow within a respective channel between source and drain, and the channel itself may be created by applying adequate potential to the gate contact and inverting semiconductor surface underneath the gate. Metal oxide semiconductor field effect transistor (MOSFET) structure may be implemented with Si and SiO2 gate oxides. In a CMOS configuration, efficient switching may be achieved for logic and memory applications. The component transistors of a CMOS transistor may be designated as a PMOSFET (p-channel, n-type Si substrate) and NMOSFET (n-channel, p-type Si substrate) transistor, which together form a basic CMOS cell.

Some transistor cells of IC layout 100 may have opposite doping configuration from other portions of IC layout 100, e.g., to provide further device functions and/or forms of logic. Thus, various regions of IC layout 100 may be subdivided into "non-flipped well" cells 102 and "flipped well" cells 104. Non-flipped well cells 102 may include a region of doped substrate material directly adjacent a doped well region in a first configuration, while flipped well cells 104 may include a region of doped substrate material directly adjacent a doped well region in a second configuration opposite the first configuration. For instance, within non-flipped well cells 102, the doped substrate material may transition to doped well material with respect to the positive direction along the Y-axis, while doped well material may transition to oppositely doped substrate material with respect to the positive direction along the Y-axis in flipped well cells 104. Several examples of such an arrangement are described elsewhere herein. As shown in the FIG. 1 example, non-flipped well cells 102 may be positioned alongside flipped well cells 104 according to various arrangements. In contrast to conventional IC layouts, embodiments of IC layout 100 may include various transistor cells shaped to separate non-flipped well cells 102 from flipped well cells 104 without the use of vacant space.

Figure 2:
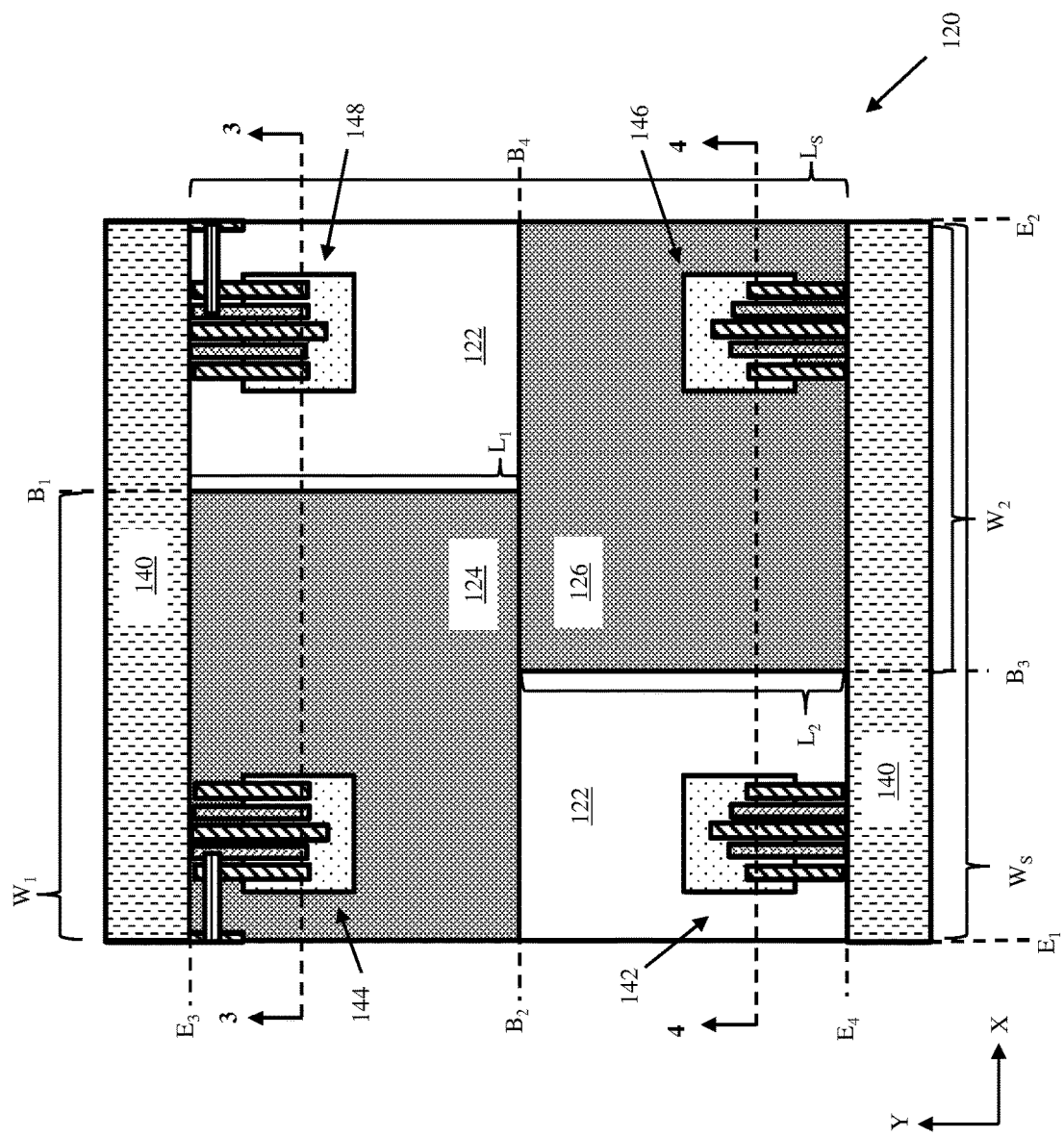
FIG. 2 depicts a transistor cell structure according to embodiments of the disclosure.

Referring now to FIG. 2, a transistor cell 120 is shown according to embodiments of the disclosure. Transistor cell 120 is shown without adjacent transistor cells in FIG. 2 solely for ease of illustration. The position of transistor cell 120 relative to other portions of IC layout 100 is discussed elsewhere relative to other FIGS. Transistor cell 120 may include a substrate region 122 formed of one or more of the example substrate materials discussed elsewhere herein regarding IC layout 100. Substrate region 122 may have a width $W_S$ on the X-axis between a first end $E_1$ and a second end $E_2$, and a length $L_S$ extending between a third end $E_3$ (alternatively identifiable as an "upper end") and a fourth end $E_4$ (alternatively identifiable as a "lower end") in a direction orthogonal to width $W_S$. Substrate region 122 may be of a first doping type, e.g., p-type or n-type, to implement one of the complementary doping types for transistors formed therein. Methods to form transistor cell 120 according to embodiments of the disclosure thus may include forming, or otherwise providing, substrate region 122 including a doped semiconductor material within a cross-sectional area having width $W_S$ and length $L_S$.

Transistor cell 120 may include multiple doped wells for provide the opposite doping type for other transistors. Specifically, transistor cell 120 may include a first doped well (FDW) 124 within substrate region 122. The material composition of FDW 124 may include the same semiconductor material(s) as substrate region 122, but may also include various dopants in a concentration sufficient to create a second doping type, e.g., the opposite doping type with respect to substrate region 122. For example, where substrate region 122 is doped p-type, FDW 124 may be doped n-type and vice versa. FDW 124 may have an FDW width $W_1$ extending from first end $E_1$ to a first interior boundary $B_1$, e.g., along the X-axis as shown. First interior boundary $B_1$ may be located between first and second ends $E_1$, $E_2$ of substrate region 122, and in the example of FIG. 2 may be located closer to second end $E_2$ than first end $E_1$. FDW 124 may have an FDW length $L_1$ extending from third end $E_3$ to a second interior boundary $B_2$, e.g., along the Y-axis as shown. Second interior boundary $B_2$ may located between third and fourth ends $E_3$, $E_4$ of substrate region 122, and in the example of FIG. 2 may be positioned along the Y-axis midpoint of substrate region 122. Methods to form transistor cell 120 may include, e.g., implanting dopants into selected portions of substrate region 122 to form FDW 124 with predetermined dimensions and/or at a predetermined location.

Transistor cell 120 may also include a second doped well (SDW) 126, which together with FDW 124 forms an interposing structure for use between flipped and non-flipped well cells. SDW 126 may include the same or similar semiconductor materials present in semiconductor region 122. SDW 126 furthermore may have the same (i.e., second) doping type as FDW 124 and thus may include various dopant materials in the same type and concentration as FDW 124. SDW 126 may have an SDW width $W_2$ extending from second end $E_2$ to a third interior boundary $B_3$, e.g., along the X-axis as shown. Third interior boundary $B_3$ may located between first and second ends $E_1$, $E_2$ of substrate region 122, and in the example of FIG. 2 may be located closer to first end $E_1$ than second end $E_2$. SDW 126 may have an FDW length $L_2$ extending from fourth end $E_4$ to a fourth interior boundary $B_4$, e.g., along the Y-axis as shown.

Methods to form transistor cell 120 may include, e.g., implanting dopants into selected portions of substrate region 122 to form SDW 126 with predetermined dimensions and/or at a predetermined location. Following the ion implantation(s), FDW 124 and SDW 126 within substrate region 122 may allow flipped well and non-flipped well transistors to be formed on opposing horizontal sides of transistor cell 120. The shape and position of FDW 124 and SDW 126 may cause at least a portion of FDW 124 to contact SDW 126, e.g., along an interface between second and fourth interior boundaries $B_2$, $B_4$. Devices which include transistor cell 120 may be detected, e.g., by identifying at least partial contact between FDW 124 and SDW 126 along second and fourth interior boundaries $B_2$, $B_4$. Similarly, substrate region 122 being located in two distinct isolated areas may also be a detectable feature of transistor cell 120.

Referring briefly to FIGS. 2-4 together, transistor cell 120 may differ from conventional transistor cells of an IC structure by including FDW 124 and SDW 126 in a horizontally stepped configuration, i.e., non-aligned configuration, for placement between non-flipped and flipped transistor cells. In a conventional non-flipped well or flipped well transistor cell, the boundary between oppositely-doped regions may traverse an entire width of the transistor cell. By contrast, transistor cell 120 includes FDW 124 and SDW 126 shaped to create a non-linear boundary between its doped portions, with substrate regions 122 appearing in two isolated locations within transistor cell 120. To illustrate such a configuration, FIG. 4 depicts a first cross-section of transistor cell 120 with FDW 124 while FIG. 3 depicts a different cross-section of transistor cell 120 with SDW 126. Transistor cell 120 may be formed on a deep well region 128, which may be doped n-type or p-type in various embodiments of the disclosure. Deep well region 128 may be formed by any currently known or later developed process to dope a region of semiconductor material at an opposing surface, and in various implementations may electrically and physically separate adjacent transistor cells, including embodiments of transistor cell 120, from each other. Deep well region 128 may itself be positioned on an underlying region of non-doped semiconductor material(s) (not shown).

Comparing FIGS. 3 and 4, first interior boundary $B_1$ may be out of horizontal alignment with third interior boundary $B_3$, causing a different profile of dopants within transistor cell 120 along different cross-sections. However, at least a portion of each cross-section may be occupied by substrate region 122 while another portion of the cross-section includes doped semiconductor material of FDW 124 or SDW 126. Conventional transistor cells may feature cross-sections which include only one type of doped semiconductor material. Transistor cell 120 may further include a buried insulator layer 130 over substrate region(s) 122, FDW 124, and SDW 126 to provide electrical insulation between a transistor component and the doped material(s) of substrate region 122, FDW 124, and/or SDW 126, such as in a fully depleted semiconductor on insulator (FDSOI) transistor structure. Various additional materials may be formed on buried insulator layer 130. For example, as shown in FIG. 3, a first doped layer 132 may be formed over FDW 124 and a second doped layer 134 may be formed over SDW 126. Doped layers 132, 134 may themselves have opposite doping types to accommodate the complementary doping and/or device polarities at each portion of transistor cell 120.

In further processing, various transistors and/or other device structures may be formed on doped layers 132, 134 over substrate region(s) 122, FDW 124, and/or SDW 126. Specifically, a first transistor 142 (FIG. 4), a second transistor 144 (FIG. 3), a third transistor 146 (FIG. 3), and a fourth transistor 148 (FIG. 4) may be positioned on respective locations of transistor cell 120. Each transistor 142, 144, 146, 148 may include at least a transistor gate G, a source contact S, and a drain contact D. Portions of doped layer(s) 132, 134 thereunder may provide the source, drain, and channel regions of the transistor. Transistors 142, 144, 146, 148 and their subcomponents may be formed by successive deposition and etching of materials on transistor cell 120. During operation of transistors 142, 144, 146, 148, voltages may be applied to transistor gate G to affect the passage of current across other terminals. Applied voltages exceeding a threshold value may control whether current is able to pass between source and drain contacts S, D. Source and drain contacts S, D, and transistor gate G may be electrically coupled to various other components through a power rail 140 (FIG. 2), as discussed elsewhere herein. The doping types and dopant concentrations within substrate region 122, FDW 124, and/or SDW 126 may affect the electrical behavior of each transistor 142, 144, 146, 148, including the ability to apply forward or reverse electrical biases thereto.

Any and all transistors discussed herein, including transistor(s) 142, 144, 146, 148 and/or other transistors coupled to transistor cell 120 may take the form of an FDSOI transistor. An FDSOI transistor can be formed to include back gate contacts BG electrically coupled to substrate region 122, FDW 124, and/or SDW 126. In this case, portions of substrate region 122, FDW 124, SDW 126 may be a back-gate region of a transistor which may be n-type or p-type doped. Buried insulator layer 130 can separate the back-gate region source/drain regions of transistor(s) 142, 144, 146 on transistor cell 120. The use of FDSOI technology provides various advantages such as an adjustable electric potential within the back-gate region of a transistor.

Returning to FIG. 2, embodiments of transistor cell 120 may include additional materials thereon to serve various functions in an IC structure. Specifically, transistor cell 120 may include one or more power rails 140 adjacent third end $E_3$ and/or fourth end $E_4$ of substrate region 122. Power rail(s) 140 may be structured to deliver electrical power for driving the operation of transistors 142, 144, 146, 148 located on various portions of transistor cell 120, e.g., to drive various logic functions implemented using the respective transistors. Each power rail 140 may be formed on transistor cell 120 by successive etching and deposition, such that power rail 140 is adjacent substrate region 120 and/or may physically separate transistor cell 120 from another transistor cell. As an illustrative example, transistor cell 120 may include transistors 142, 144, 146, 148 each positioned on a respective region of doped semiconductor material(s). According to an example, first transistor 142 may be positioned over on FDW 124, second transistor 144 may be positioned over SDW 126, third transistor 146 may be positioned over substrate region 122 between SDW 126 and first end $E_1$, and/or fourth transistor 148 may be positioned over substrate region 122 between FDW 124 and second end $E_2$. By this arrangement, transistor cell 120 may provide multiple transistors to implement various logic functions using power rail 140, without significant portions of substrate material 122 being left vacant. Example implementations and advantages of transistor cell 120 are thus discussed in further detail herein with regard to adjacent transistors formed in non-flipped well cells and flipped well cells of a device.

Figure 5:
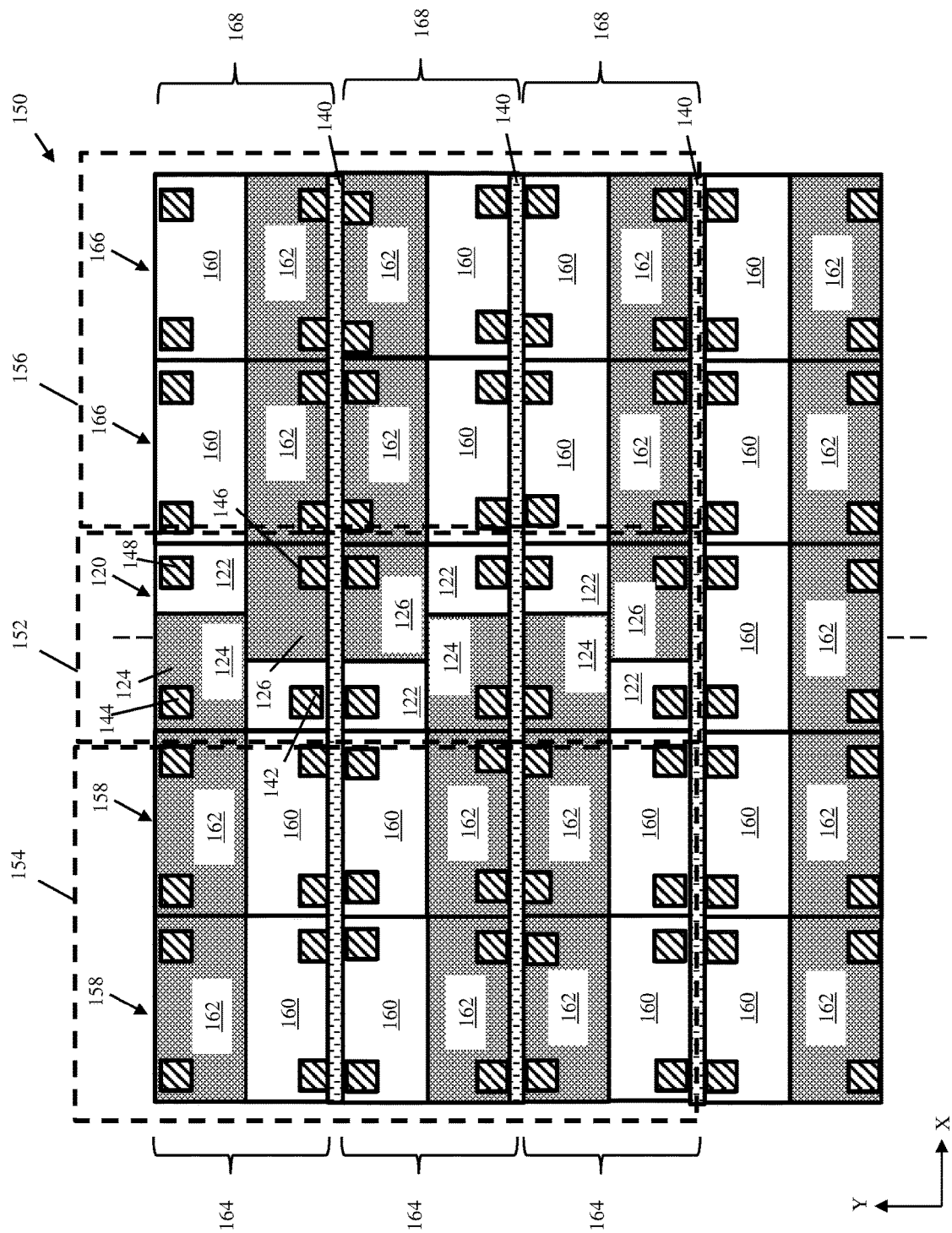
FIG. 5 depicts a plan view of an IC structure with multiple transistor cells according to embodiments of the disclosure.

Referring now to FIG. 5, embodiments of the disclosure provide an integrated circuit (IC) structure 150 with an embodiment of one or more transistor cells 120 included therein. Transistor cell(s) 120 may physically separate one or more non-flipped well transistor cells from one or more flipped well transistor cells without relying on vacant space to separate the different cell types from each other. The portion of IC structure 150 depicted in FIG. 5 may represent a corner junction between a region of non-flipped well transistor cells and a surrounding region of flipped well transistor cells. Various transistors 142, 144, 146, 148 of IC structure 150 are indicated with cross-hatching solely for clarity of illustration. According to one example, a group of transistor cells 120 may be arranged in an interposing region 152 horizontally between a non-flipped well region 154 and a flipped well region 156 of IC structure 150. Region 152 is depicted as a row in the accompanying FIG. 5, but it is understood that other types of regions (e.g., columns, interior surface areas, exterior surface areas, etc.) may be used. The location of transistor cell(s) 120 in IC structure 150 between non-flipped well region 154 and flipped well region 156 may be known as an "interposer region."

In various embodiments of the disclosure, layout 100 may include IC structure 150 with an edge (e.g., a physical interface) between one non-flipped well region 154 and one flipped well region 156. The edge between regions 154, 156 can allow automatic placement and routing tools to place embodiments of IC structure 150 at the correct locations and or boundaries, thereby verifying the integrity of the doped areas and their placement. This allows further manufacturing processes and/or tools for automatic placement and routing of logic, to be implemented without significant errors or disruptions. Non-flipped well region 154 may include several non-flipped well transistor cells 158, each of which may include a substrate portion 160 (e.g., having a same doping type as substrate region 122) abutting a doped well portion 162 (e.g., having a same doping type as FDWs 124 and SDWs 126) in a first orientation. Various power rails 140 of IC structure 150 may extend lengthwise (e.g., in the direction of the X-axis) through non-flipped well region 154 and flipped well region 156 to drive the operation of transistors within each region 154, 156 in addition to transistor cell(s) 120, where applicable.

In an illustrative example, each non-flipped well transistor cell 156 may include substrate portion 160 and doped well portion 162 in approximately equal halves and according to design rules for the size and spacing of transistor cells in layout 100, with the interface between each portion 160, 162 extending in the direction of the X-axis. In some cases, non-flipped well transistor cells 158 may be arranged in rows 164, such portions 160, 162 of non-flipped well transistor cells 158 abut substrate region 122 and FDW 124 or SDW 126 of the same doping type. For example, one transistor cell 120 includes substrate region 122 directly contacting and abutting substrate portion 160 of non-flipped well transistor cell 158, and FDW 124 directly contacting and abutting doped well portion 162 of non-flipped well transistor cells 158.

IC structure 150 may also include flipped well transistor cells 166 in flipped well region 156. One or more flipped well transistor cells 166 may be adjacent transistor cell(s) 120 at a location opposite non-flipped well transistor cells 158. Each flipped well transistor cell may include substrate portion 160 and doped well portion 162 with similar or identical compositions and/or doping types as compared to non-flipped well transistor cells 158. However, flipped well transistor cells 166 may feature substrate portion 160 and doped well portion in an opposite X-Y orientation compared to non-flipped well transistor cells 158. As shown, flipped well transistor cells 166 may be arranged in rows 168, such that each row 168 of flipped well transistor cells 166 is horizontally aligned with a corresponding row 164 of non-flipped well transistor cells 158. In this arrangement, transistor cell(s) 120 may be interposed directly between one non-flipped well transistor cell 158 and one flipped well transistor cell 166, and more generally between two rows 164, 168 of each transistor cell type. In this arrangement, substrate region 122 of transistor cell 120 may contact and abut substrate portion 160 of flipped well transistor cell 166, and SDW 126 of transistor cell 120 may contact and abut doped well region 162 of one flipped well transistor cell 166.

Figure 6:
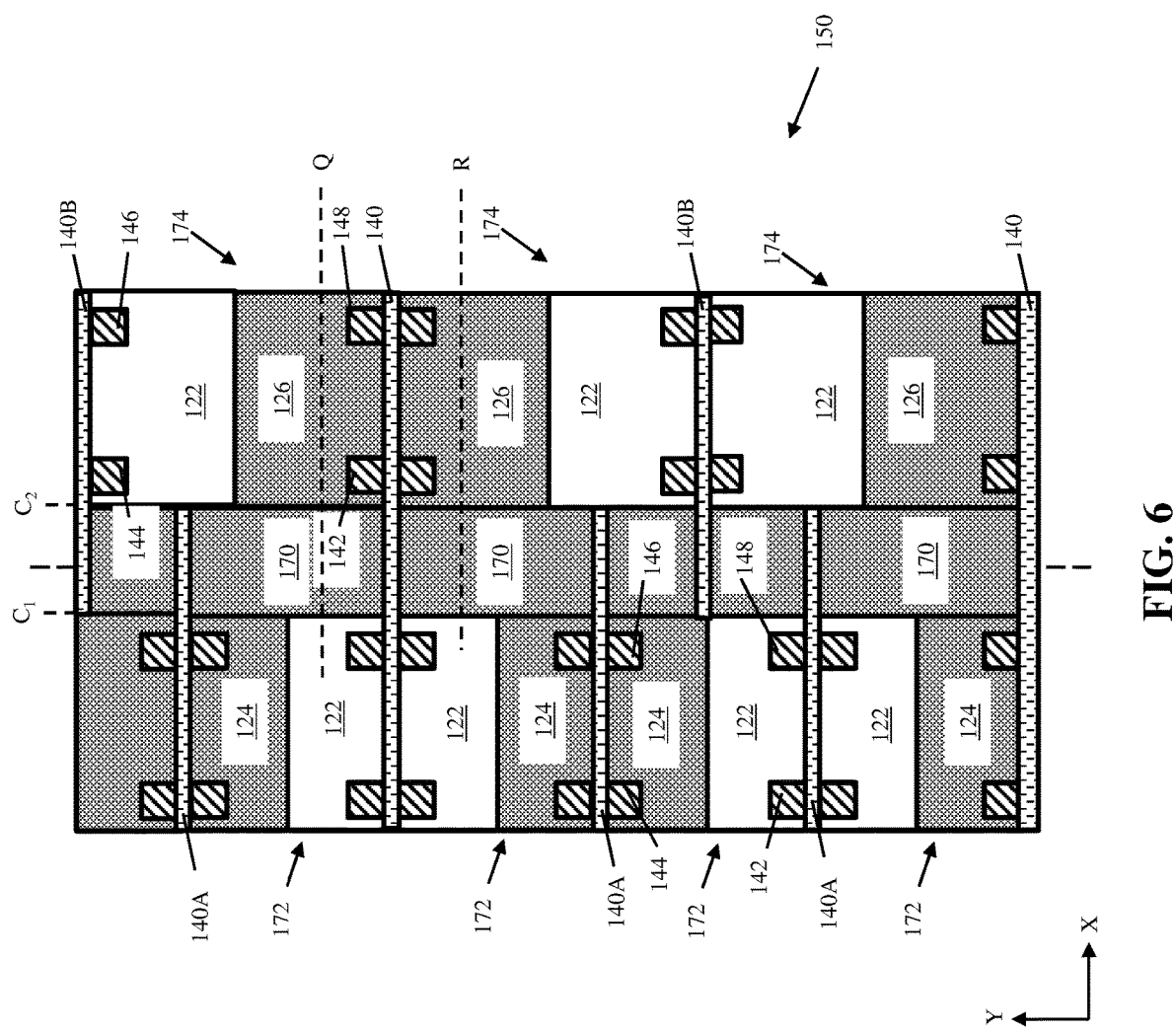
FIG. 6 depicts a plan view of an IC structure according to further embodiments of the disclosure.

Turning to FIG. 6, further embodiments of IC structure 150 may include features for horizontally separating transistor cells of different sizes, but with substrate portion(s) 160 and doped well portion(s) 162 in the same orientation. For example, two regions of one IC structure 150 may be designed to include transistor cells with different lengths in the Y-axis direction. Conventionally, such regions would be separated from each other by vacant space without any functional device components being formed in the region of separation. Embodiments of IC structure 150, however, may include additional features and/or structures for improving the density of features at locations where transistor cells of one size transition to transistor cells of another size.

According to an example, IC structure 150 may include a doped barrier region 170 within a semiconductor substrate. Doped barrier region 170 may have a width (e.g., along the X-axis) that is less than various transistor cells of IC structure 150. However, doped barrier region may be free of transistor structures thereon. A first plurality of transistor cells 172 may be adjacent to, or may abut, a first exterior boundary $C_1$ of doped barrier region 170. First plurality of transistor cells 172 may include substrate regions 122 of a first doping type alternating with FDWs 124 of the opposite doping type. A first plurality of power rails 140A each may be positioned above, and/or horizontally between, adjacent cells of first plurality 172, in addition to crossing at least a portion of doped barrier region 170. First plurality of transistor cells 172 may be detectable by having a uniform length in the direction of the Y-axis. Additionally, in an example embodiment, the orientation of substrate regions 122 and FDWs 124 in the direction of the Y-axis may change from one cell to another. First plurality of transistor cells 172 each may include first and fourth transistors 142, 148 on substrate region 122, as well as second and third transistors 144, 146 on FDW 124. Each transistor 142, 144, 146, 148 may take the form of an FDSOI transistor as described elsewhere herein. Transistors 142, 144, 146, 148 of IC structure 150 are indicated with cross-hatching solely for clarity of illustration.

IC structure 150 may include additional cell structures sized differently from first plurality of transistor cells 172. Specifically, a second plurality of transistor cells may be adjacent to, or may abut, a second exterior boundary $C_2$ of doped barrier region 170, opposite first exterior boundary $C_1$. Second plurality of transistor cells 174 may include substrate regions 122 of a first doping type alternating with SDWs 126 of the opposite doping type. In contrast to first plurality of transistor cells 172, second plurality of transistor cells 174 may have a length dimension (e.g., along the Y-axis) that is different from the length dimension of first plurality of transistor cells 172. However, first and second pluralities of transistor cells 172, 174 may have similar or identical widths (e.g., in the direction of X-axis) with respect to each other. A second plurality of power rails 140B each may be positioned above, and/or horizontally between, adjacent cells of second plurality 174, in addition to crossing at least a portion of doped barrier region 170. Second plurality of transistor cells 174 may be detectable by having a uniform length (e.g., in the direction of the Y-axis) that is different from any of first plurality of transistor cells 172. Similar to first plurality of transistor cells 172, the orientation of substrate regions 122 and FDWs 124 in the direction of the Y-axis may change from one cell to another. Second plurality of transistor cells 174 each may include first and fourth transistors 142, 148 on substrate region 122, as well as second and third transistors 144, 146 on SDW 126. Each transistor 142, 144, 146, 148 may take the form of an FDSOI transistor as described elsewhere herein.

In the arrangement shown, each power rail 140A, 140B may be positioned at least partially over doped barrier layer 170, yet may also be positioned over at least one respective plurality of transistor cells 172, 174. In some cases, e.g., where the boundary between substrate region 122 and FDW 124 in one transistor cell is horizontally aligned with the boundary between substrate region 122 and SDW 126 of another transistor cell, one power rail 140 may extend horizontally over each plurality of transistor cells 172, 174 as well as doped barrier region 170. In other cases, each power rail 140A, 140B, may extend over only one plurality of transistor cells 172, 174. Due to the differences in length between each transistor cell in first plurality 172 and second plurality 174, at least one substrate region 122 may be horizontally aligned with at least one SDW 126 (e.g., along line Q of FIG. 6), and at least one substrate region 122 may be horizontally aligned with at least one FDW 124 (e.g., along line R of FIG. 6). In further embodiments, first and second pluralities of transistor cells 172, 174 each may be non-flipped well transistor cells or flipped well transistor cells, but this is not necessarily the case in all implementations.

Embodiments of the disclosure provide various technical and commercial advantages, some of which are described by example herein. In embodiments of the disclosure, regions of an IC structure previously-occupied by vacant space may now be designed to accommodate additional transistors with different types of doping. Transistor cell structures according to the disclosure, may also reduce the separation distance between non-flipped well and flipped well transistor cells and thus may allow a greater number of transistors to be formed within a surface areahy of a product. Further embodiments of the disclosure also allow transistor cells of varying size to be formed within one IC layout with minimal penalty to the surface area occupied by such transistors, e.g., by providing a doped barrier region which may have various power rails formed thereon. The various transistor cell and IC structures described herein may be shaped to occupy the same amount of space as adjacent transistor cells, thereby allowing the use of standard logic cells in flipped and non-flipped well regions without significant penalty to device area.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A transistor cell having a width between a first end and a second end, and a length between a third end and a fourth end in a direction orthogonal to the width, comprising:
  a substrate region having a first doping type;
  a first doped well (FDW) within the substrate region, the FDW having a second doping type and an FDW width extending from the first end of the transistor cell to a first interior boundary between the first and second ends of the transistor cell, and an FDW length extending from the third end of the transistor cell to a second interior boundary between the third and fourth ends of the transistor cell; and
  a second doped well (SDW) within the substrate region, the SDW having the second doping type and an SDW width extending from the second end of the transistor cell to a third interior boundary between the first and second ends of the transistor cell, and a length extending from the fourth end of the transistor cell to a fourth interior boundary between the third and fourth ends of the transistor cell, wherein the first interior boundary is non-aligned with the third interior boundary, and wherein a portion of the fourth interior boundary abuts a portion of the second interior boundary;
  wherein a first portion of the substrate region has a width extending from the first internal boundary to the second end of the transistor cell, and a length extending from the third end of the transistor cell to the fourth interior boundary, and
  wherein a second portion of the substrate region has a width extending from the first end of the transistor cell to the third interior boundary, and a length extending from fourth end of the transistor cell to the second interior boundary, wherein the first portion of the substrate region and the second portion of the substrate region are separate from the FDW and the SDW.

2. The transistor cell of claim 1, wherein the first end of the transistor cell borders a first row of adjacent transistor cells each having a doped well portion abutting a semiconductor portion in a first orientation.

3. The transistor cell of claim 2, wherein the second end of the transistor cell borders a second row of adjacent cells each having a doped well portion abutting a semiconductor portion in a second orientation opposite the first orientation, the first row of adjacent cells being a set of non-flipped well transistor cells, and the second row of adjacent cells being a set of flipped well transistor cells.

4. The transistor cell of claim 3, wherein one of the set of non-flipped well transistor cells directly contacts the FDW and one of the set of flipped well transistor cells directly contacts and abuts the SDW.

5. The transistor cell of claim 1, further comprising:
  a first transistor formed on the FDW;
  a second transistor formed on the SDW;
  a third transistor formed on the second portion of the substrate region between the SDW and the first end of the transistor cell; and
  a fourth transistor formed on the first portion of the substrate region between the FDW and the second end of the transistor cell.

6. The transistor cell of claim 5, wherein at least one of the first transistor, the second transistor, the third transistor, or the fourth transistor comprises a fully depleted semiconductor on insulator (FDSOI) transistor.

7. The transistor cell of claim 1, further comprising:
  a first power rail adjacent the third end of the transistor cell, wherein the power rail is electrically coupled to a transistor positioned on the first portion of the substrate region and a transistor positioned on the FDW, and a second power rail adjacent the fourth end of the transistor cell, wherein the power rail is electrically coupled to a transistor positioned on the second portion of the substrate region and a transistor positioned on the SDW.

8. The transistor cell of claim 1, further comprising:

a flipped-well transistor formed on one of the FDW or the SDW; and a non-flipped transistor formed on the other of the FDW or the SDW, wherein the flipped-well transistor and the non-flipped transistor are formed on opposing horizontal portions of the transistor cell.

9. The transistor cell of claim 1, further comprising a buried insulator layer formed over the substrate region, the FDW, and the SDW.

10. The transistor cell of claim 1, further comprising a deep well region, wherein the substrate region, the FDW, and the SDW are formed on the deep well region.

11. The transistor cell of claim 1, wherein the FDW and the SDW are formed on first opposing horizontal portions of the transistor cell.

12. The transistor cell of claim 11, wherein the first portion of the substrate region and the second portion of the substrate region are formed on second opposing horizontal portions of the transistor cell.

13. The transistor cell of claim 1, wherein a portion of the FDW contacts a portion of the SDW where the portion of the fourth interior boundary abuts the portion of the second interior boundary.

* * * * *